United States Patent [19]
Chen

[11] Patent Number: 5,872,043
[45] Date of Patent: Feb. 16, 1999

[54] METHOD OF PLANARIZING WAFERS WITH SHALLOW TRENCH ISOLATION

[75] Inventor: Lai-Juh Chen, Hsin-chu, Taiwan

[73] Assignee: Industrial Technology Research Institute, Hsin-Chu, Taiwan

[21] Appl. No.: 690,405

[22] Filed: Jul. 25, 1996

[51] Int. Cl.$^6$ .................................................. H01L 21/76
[52] U.S. Cl. ........................ 438/424; 438/430; 438/692; 438/699
[58] Field of Search ...................... 437/67; 148/DIG. 80, 148/DIG. 85, DIG. 86; 156/636.1; 438/424, 430, 692, 699, 227

[56] References Cited

U.S. PATENT DOCUMENTS

| | | | |
|---|---|---|---|
| 5,246,884 | 9/1993 | Jaso et al. | 437/225 |
| 5,346,584 | 9/1994 | Nasr et al. | |
| 5,560,802 | 10/1996 | Chisolm | |

OTHER PUBLICATIONS

"SOG Smoothing Technique For Planarization of Shallow Trench Isolation" by Lai–Juh Chen et al. 1996 Proceedings First International Chemical–Mechanical Polish (CMP) For VLSI/ULSI Multilevel Interconnection Conference (CMP–MIC), Feb. 22–23, 1996, pp. 307–314.

*Primary Examiner*—George Fourson
*Attorney, Agent, or Firm*—George O. Saile; Stephen B. Ackerman; Larry J. Prescott

[57] ABSTRACT

This invention describes a method of using Chemical Mechanical Polishing to planarize integrated circuit wafers using shallow trench isolation to provide isolation between devices in the wafer. After the material used to fill the shallow trenches has been formed a layer of Spin On Glass is formed over the material used to fill the shallow trenches. The polishing rate for the material used to fill the shallow trenches is at least twice as large as the polishing rate of the Spin On Glass. This difference in polishing rate causes the Spin On Glass to be the controlling factor in the overall polishing rate and a planar surface free of dishing or unwanted residue is achieved. In at least one of the embodiments the rate of change of the polishing pad temperature can be used to determine the end point of the polishing.

15 Claims, 5 Drawing Sheets

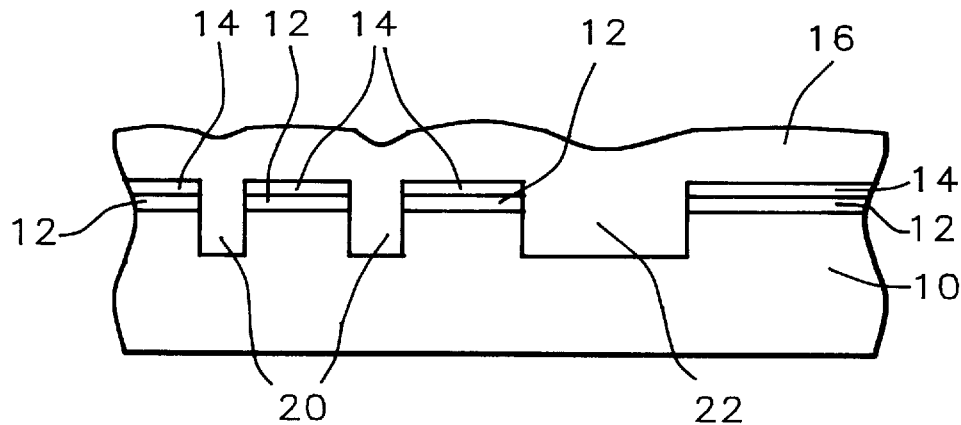
FIG. 1A – Prior Art
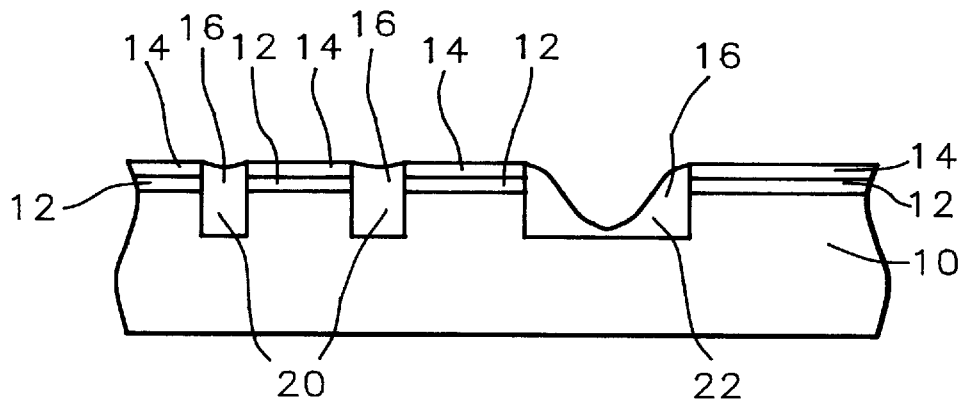
FIG. 1B – Prior Art
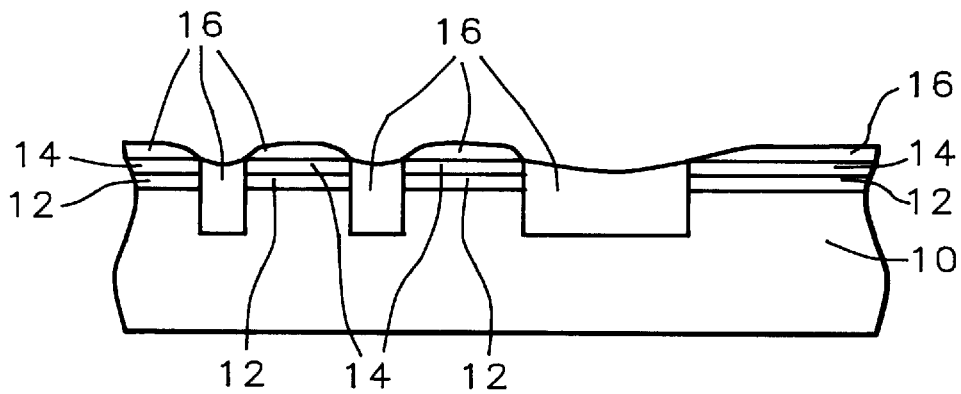
FIG. 1C – Prior Art

METHOD OF PLANARIZING WAFERS WITH SHALLOW TRENCH ISOLATION

BACKGROUND OF THE INVENTION

(1) FIELD OF THE INVENTION

This invention relates to planarization of integrated circuit wafers using shallow trench isolation and more particularly to a method of planarization using Chemical Mechanical Polishing.

(2) DESCRIPTION OF THE RELATED ART

In sub 0.5 micron applications the use of shallow trench isolation, STI, between devices in an integrated circuit wafer is frequently used in place of the local oxidation of silicon, LOCOS, process. It is important to have a planar surface for subsequent process steps after the shallow trench isolation regions have been formed. Chemical Mechanical Polishing, CMP, is frequently used for planarization but this method has problems of dishing and residual oxide on the wafer surface. This Patent Application describes a method using a Spin On Glass layer in combination with Chemical Mechanical Polishing to achieve planarization of integrated circuit wafers using shallow trench isolation.

U.S. Pat. No. 5,312,512 to Allman discusses the global planarization of integrated circuit wafers using Spin On Glass and Chemical Mechanical Polishing but uses a different method than that described in this Patent Application.

U.S. Pat. No. 5,246,884 to Jaso describes a Chemical Mechanical Polishing process for shallow trench isolation devices wherein trench areas have a slower polishing rate than the higher areas. This method does not discuss Spin On Glass.

The methods of this invention are described in a paper by the inventor entitled "SOG Smoothing Technique For Planarization of Shallow Trench Isolation," by Lai-Juh Chen et al., 1996 Proceedings First International Chemical-Mechanical Polish (C.M.P.) For VLSI/ULSI Multilevel Interconnection Conference (CMP-MIC), Feb. 22–23, 1996, pages 307–314.

SUMMARY OF THE INVENTION

Local oxidation of silicon, or LOCOS, isolation processes have long been used to provide device isolation in integrated circuit elements. When used in sub 0.5 micron applications, however, LOCOS limitations such as the lateral effects of the LOCOS birds beak, non-planarity, thinning, and stress-induced silicon defects cause severe problems. Shallow Trench Isolation, STI, wherein trenches are formed in the integrated circuit wafer and filled with an insulator has been used to provide device isolation for devices in the sub 0.5 micron range. Since the material filling the trenches is applied in a blanket type deposition the wafer must be planarized after the trenches have been filled.

Serious problems are encountered in planarizing the integrated circuit wafer after the isolation trenches have been filled. FIG. 1A shows a cross section of an integrated circuit wafer 10 with a layer of pad oxide 12 and a layer of $Si_3N_4$ 14 formed on the integrated circuit wafer. Shallow isolation trenches 20 and 22 are formed in the integrated circuit wafer 10. The shallow isolation trenches can be relatively narrow trenches 20, having a width of about 0.3 microns and wider trenches 22, having a width of several microns. A layer of dielectric material 16, such as silicon dioxide, is formed on the integrated circuit wafer and fills the trenches. The dielectric material 16 above the plane of the layer of $Si_3N_4$ 14 must then be removed and the wafer planarized so that dielectric material 16 remains only in the shallow isolation trenches 20 and 22.

Planarizing the wafer to remove the dielectric material 16 above the plane of the layer of $Si_3N_4$ 14 and leave the dielectric material 16 below the plane of the layer of $Si_3N_4$ 14 is a significant problem. FIG. 1B shows a cross section of a wafer after using Reactive Ion Etch, or RIE, as an etchback to planarize the wafer. As shown in FIG. 1B, while the RIE process removes all the dielectric material above the plane of the layer of $Si_3N_4$ the surface of the dielectric material remaining in the shallow isolation trenches is not planar, especially in the wider trenches 22 where severe dishing occurs. FIG. 1C shows a cross section of a wafer after using Chemical Mechanical Polishing, CMP, to planarize the wafer. As shown in FIG. 1C, planarizing with CMP leaves some dielectric material 16 above the plane of the layer of $Si_3N_4$ and dishing occurs in the wider trenches 22.

It is an objective of this invention to provide a method of planarizing an integrated circuit wafer with shallow isolation trenches filled with dielectric material, such as gap-fill oxide, using chemical mechanical polishing which leaves dielectric material only in the shallow isolation trenches and achieves a planar surface.

It is a further objective of this invention to provide a method of planarizing an integrated circuit wafer with shallow isolation trenches covered by a layer of insulator oxide and filled with polysilicon using chemical mechanical polishing which leaves polysilicon only in the shallow isolation trenches and achieves a planar surface.

These objectives are achieved by forming a layer of Spin On Glass, SOG, on the layer of material used to fill the shallow isolation trenches and which is to be removed using chemical mechanical polishing. The polishing rate for the trench filling material is greater than the polishing rate for the spin on glass by at least a factor of two. The spin on glass controls the polishing rate of the planarization and prevents dishing or leaving trench filling material above the plane of the layer of $Si_3N_4$.

BRIEF DESCRIPTION OF THE DRAWINGS

FIG. 1A shows a cross section of an integrated circuit wafer with shallow isolation trenches with a layer of oxide formed on the integrated circuit wafer filling the trenches.

FIG. 1B shows a cross section of an integrated circuit wafer with shallow isolation trenches which has been planarized using conventional Reactive Ion Etching.

FIG. 1C shows a cross section of an integrated circuit wafer with shallow isolation trenches which has been planarized using conventional Chemical Mechanical Polishing.

DESCRIPTION OF THE PREFERRED EMBODIMENTS

Figure 2:
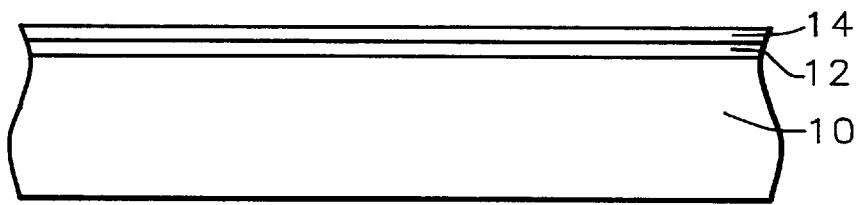
FIG. 2 shows a cross section of an integrated circuit wafer with a layer of pad oxide and a layer of silicon nitride, $Si_3N_4$, formed thereon.
Figure 3:
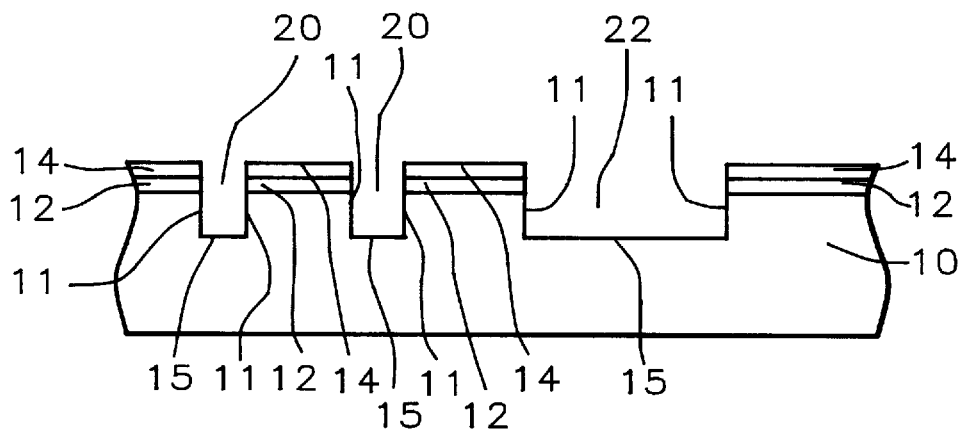
FIG. 3 shows a cross section of an integrated circuit wafer with a layer of pad oxide and a layer of silicon nitride, $Si_3N_4$, formed thereon, and shallow isolation trenches formed therein.
Figure 4:
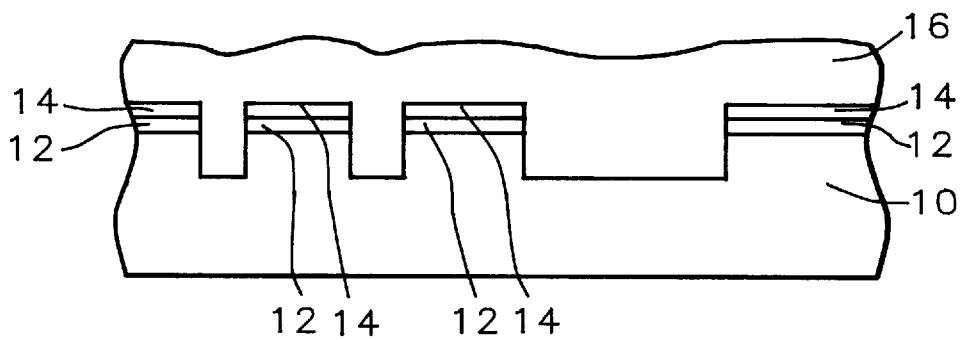
FIG. 4 shows a cross section of the integrated circuit wafer of FIG. 3 with a layer of oxide formed thereon thereby filling the shallow isolation trenches.

Refer now to FIGS. 2–7, there is shown an embodiment of the method for planarizing wafers with shallow trench isolation of this invention. FIG. 2 shows a cross section of an integrated circuit wafer 10 having devices formed therein, not shown, and a layer of pad oxide 12, having a thickness of between about 200 and 300 Angstroms, and a layer of $Si_3N_4$ 14, having a thickness of between about 1200 and 1800 Angstroms, formed thereon. As shown in FIG. 3 trenches 20 and 22, in order to form the shallow isolation trenches, are then formed in the integrated circuit wafer 10 thereby also removing that part of the layer of pad oxide 12 and that part of the layer of $Si_3N_4$ 14 directly above the trenches. The trenches have a depth of between about 0.4 microns and 0.6 microns. The trenches can have different widths ranging from about 0.3 microns to several microns. FIG. 3 shows trenches at the narrow end of the width range 20 as well as trenches at the wider end of the width range 22.

Figure 5:
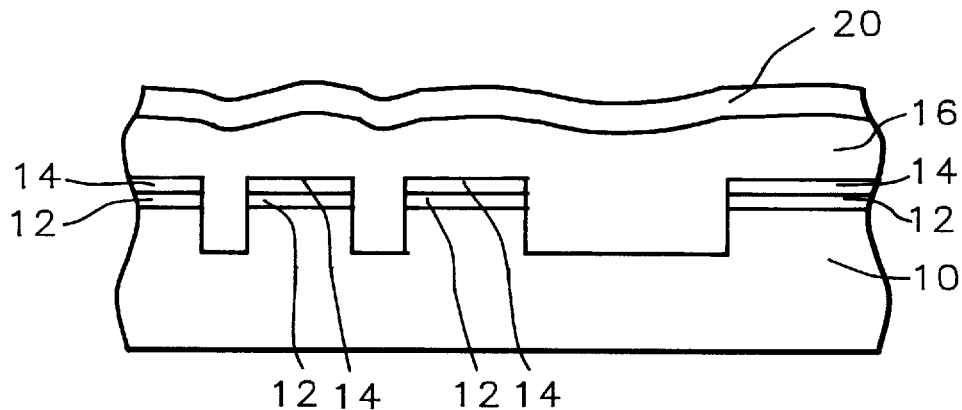
FIG. 5 shows a cross section of the integrated circuit wafer of FIG. 4 with a layer of Spin On Glass formed on the layer of oxide.

Next a layer of isolation oxide 16 is formed over the integrated circuit wafer 10 thereby filling the trenches with dielectric. In this example the isolation oxide 16 is $SiO_2$ having a thickness of between about 6000 and 15,000 Angstroms formed by decomposition of tetraethyl orthosilicate, TEOS. The $SiO_2$ layer can also be formed using decomposition of ozone tetraethyl orthosilicate, $O_3$-TEOS, or using a high density plasma discharge. Next, as shown in FIG. 5, a layer of Spin On Glass 20, $SiO_x$, having a thickness of between about 2000 and 6000 Angstroms is formed over the layer of isolation oxide 16. The wafer is coated with Spin On Glass, baked at a temperature of between about 100° and 300° C. for between about 30 and 150 seconds and cured in nitrogen at a temperature of between about 350° and 450° C. for between about 25 and 35 minutes. More than one layer of Spin On Glass can be used. If a single layer of Spin On Glass is used the wafer is coated, baked and cured in nitrogen. If more than one layer of Spin On Glass is used the wafer is coated and baked for each layer and all layers of Spin On Glass are then cured in nitrogen.

Figure 6:
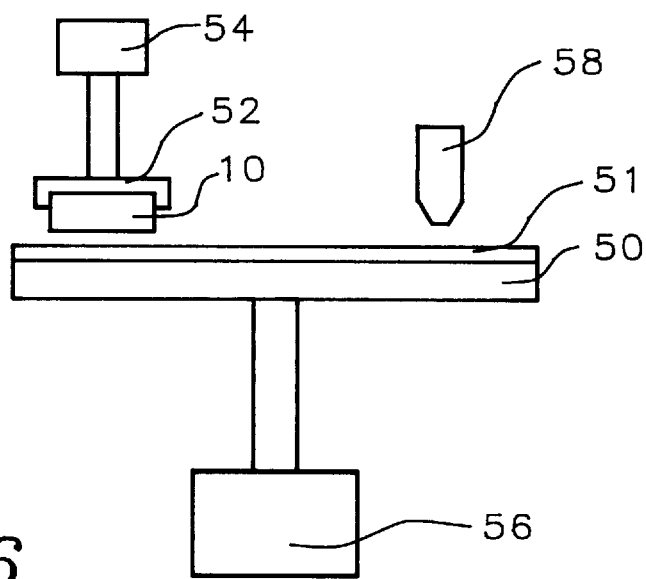
FIG. 6 shows a block diagram of a Chemical Mechanical Polishing apparatus.

Next, as shown in FIG. 6, the wafer 10 is planarized by means of Chemical Mechanical Polishing using an oxide slurry. The Chemical Mechanical Polishing apparatus comprises a wafer carrier 52 holding the wafer 10 to be polished. The wafer carrier 52 is attached to a carrier drive motor 54 which can supply motion to the wafer carrier 52 and thereby to the wafer 10. The wafer is held in contact with a polishing pad 51 attached to a platen 50. The platen 50 is attached to a platen drive motor 56 which can supply rotating motion to the platen 50 and thereby to the polishing pad 51. A slurry dispenser 58 supplies an oxide abrasive slurry to the polishing pad 51.

Figure 7:
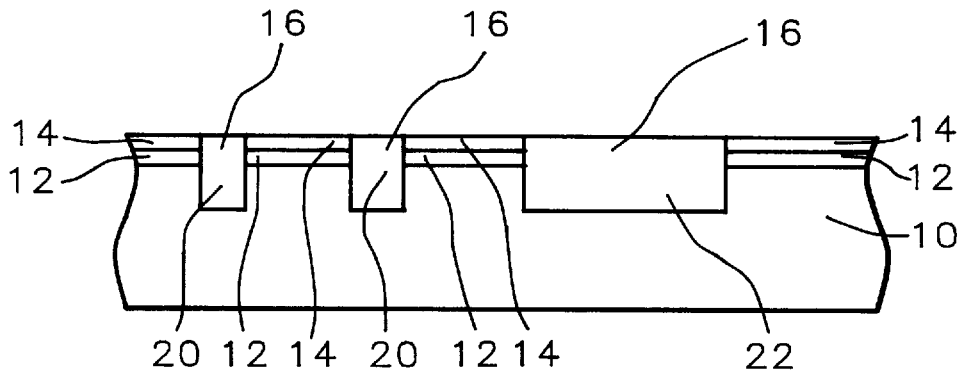
FIG. 7 shows a cross section of the integrated circuit wafer of FIG. 5 after being planarized using Chemical Mechanical Polishing.

The polishing rate of the Spin On Glass is about 500 Angstroms per minute and the polishing rate of the $SiO_2$ isolation oxide is about 1000 Angstroms per minute or about two times greater than the rate for the Spin On Glass. As shown in FIG. 7, the Chemical Mechanical Polishing operation removes the Spin On Glass layer and that part of the layer of isolation oxide above the plane of the layer of $Si_3N_4$ 14. The Spin On Glass, having a lower polishing rate, controls the rate of polishing and prevents irregularities, such as dishing, in the planarized surface. The trenches, 20 and 22, are filled with isolation dielectric, such as $SiO_2$, 16 and form shallow trench isolation between the devices in the integrated circuit wafer. This method produces a planar surface for wider trenches 22 as well as for narrower trenches 20.

Refer now to FIGS. 3, 6, and 8–11, there is shown another embodiment of the method for planarizing wafers with shallow trench isolation of this invention. As in the previous embodiment trenches 20 and 22, each trench having sidewalls 11 and a bottom 15, are formed in an integrated circuit wafer 10 having devices formed therein, not shown, and a layer of pad oxide 12 and a layer of $Si_3N_4$ 14 formed thereon, see FIG. 3. As in the preceding embodiment that part of the layer of pad oxide 12 and that part of the layer of $Si_3N_4$ 14 directly over the trenches is removed when the trenches are formed. The trenches have a depth of between about 0.4 microns and 0.6 microns. The trenches can have different widths ranging from about 0.3 microns to several microns. FIG. 3 shows trenches at the narrow end of the width range 20 as well as at the wider end of the width range 22.

Figure 8:
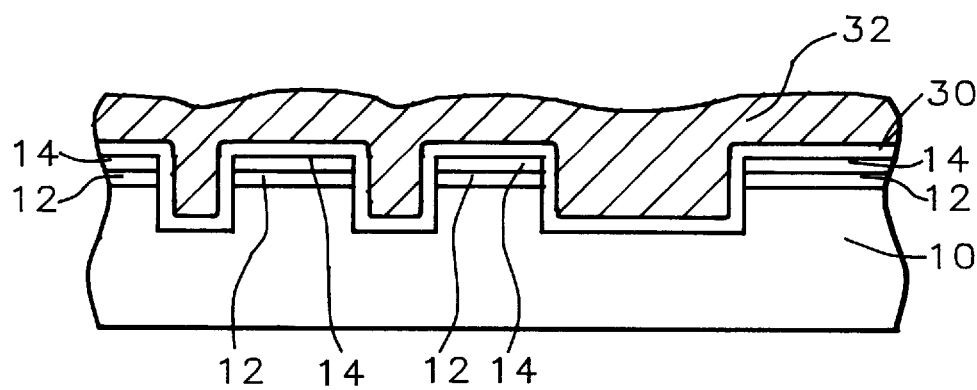
FIG. 8 shows a cross section of the integrated circuit wafer of FIG. 3 with a layer of silicon dioxide formed over the shallow isolation trenches and a layer of polysilicon formed over the layer of silicon dioxide thereby filling the shallow isolation trenches.

Next, as shown in FIG. 8, a layer of insulator oxide 30, such as $SiO_2$, having a thickness of between about 200 and 800 Angstroms is formed over the integrated circuit wafer covering the sidewalls and bottoms of the trenches. A layer of polysilicon 32 having a thickness of between about 6000 and 15,000 Angstroms is then formed over the layer of insulator oxide 30 so that the trenches are filled with polysilicon and the polysilicon is insulated from the integrated circuit wafer by the layer of insulator oxide 30.

Figure 9:
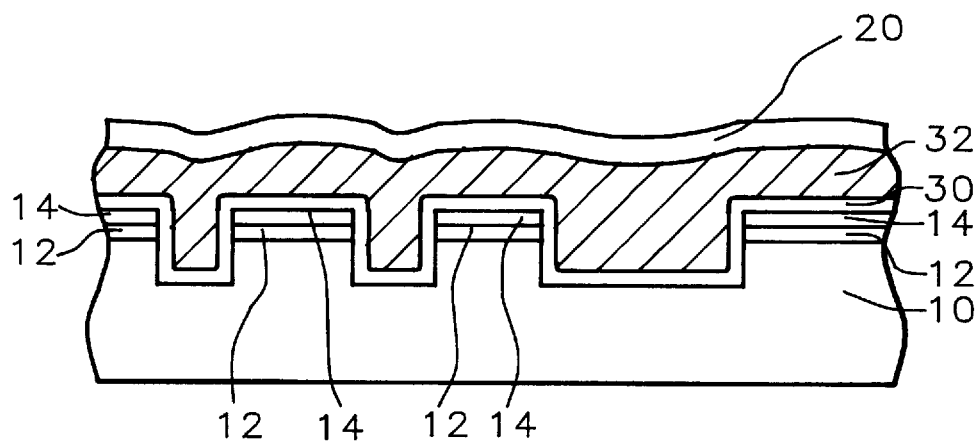
FIG. 9 shows a cross section of the integrated circuit wafer of FIG. 8 with a layer of Spin On Glass formed on the layer of polysilicon.

Next, as shown in FIG. 9, a layer of Spin On Glass 20, $SiO_x$, having a thickness of between about 2000 and 6000 Angstroms is formed over the layer of polysilicon 30. As in the preceding embodiment, the wafer is coated with Spin On Glass, baked at a temperature of between about 100° and 300° C. for between about 30 and 150 seconds and cured in nitrogen at a temperature of between about 350° and 450° C. for between about 25 and 35 minutes. More than one layer of Spin On Glass can be used. If a single layer of Spin On Glass is used the wafer is coated, baked and cured in nitrogen. If more than one layer of Spin On Glass is used the wafer is coated and baked for each layer and all layers of Spin On Glass are then cured in nitrogen Next, as shown in FIG. 6, the wafer 10 is planarized by means of Chemical Mechanical Polishing using an oxide slurry. The Chemical Mechanical Polishing apparatus comprises a wafer carrier 52 holding the wafer 10 to be polished. The wafer carrier 52 is attached to a carrier drive motor 54 which can supply motion to the wafer carrier 52 and thereby to the wafer 10. The wafer is held in contact with a polishing pad 51 attached to a platen 50. The platen 50 is attached to a platen drive motor 56 which can supply rotating motion to the platen 50 and thereby to the polishing pad 51. A slurry dispenser 58 supplies an oxide abrasive slurry to the polishing pad 51.

Figure 10:
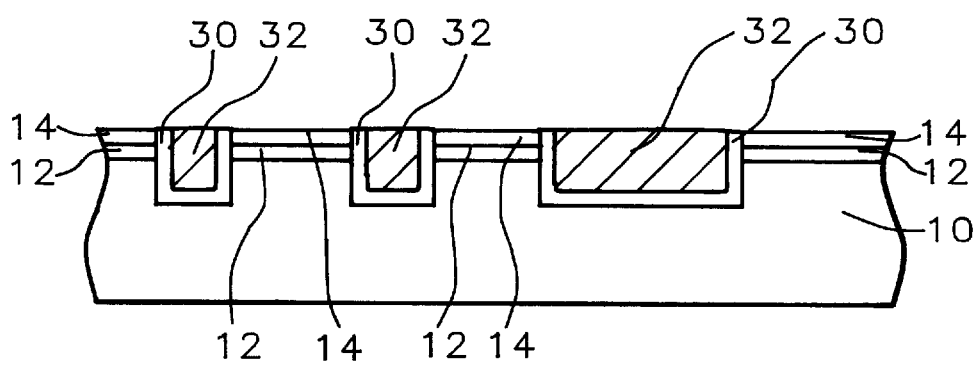
FIG. 10 shows a cross section of the integrated circuit wafer of FIG. 9 after being planarized using Chemical Mechanical Polishing.

The polishing rate of the Spin On Glass is about 500 Angstroms per minute and the polishing rate of the polysilicon is between about 2000 and 3000 Angstroms per minute or between about 4 and 6 times greater than the rate for the Spin On Glass. As shown in FIG. 10, the Chemical Mechanical Polishing operation removes the Spin On Glass layer, that part of the layer of polysilicon, and that part of the insulator oxide layer above the plane of the layer of $Si_3N_4$ 14. The Spin On Glass, having a lower polishing rate, controls the rate of polishing and prevents irregularities, such as dishing, in the planarized surface. The trenches, 20 and 22, are filled with insulator oxide 30 and polysilicon 32 and form shallow trench isolation between the devices in the integrated circuit wafer. This method produces a planar surface for wider trenches 22 as well as for narrower trenches 20.

Figure 11:
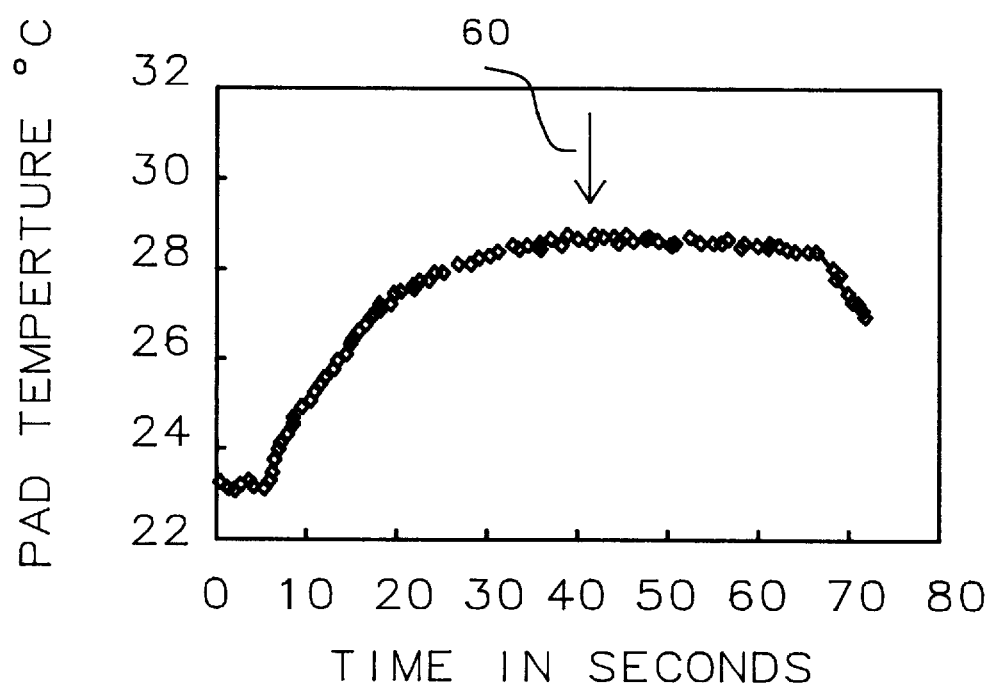
FIG. 11 shows a curve of the polishing pad temperature as a function of polishing time during Chemical Mechanical Polishing of the integrated circuit wafer having shallow isolation trenches filled with polysilicon.

FIG. 11 shows the temperature of the polishing pad 51, see FIG. 6, as a function of time during the removal of the polysilicon above the plane of the layer of $Si_3N_4$. The temperature increases until the polishing pad contacts the layer of $Si_3N_4$, indicated by reference number 60 in FIG. 11. The rate of change of pad temperature changes when the desired amount of Spin On Glass and polysilicon has been removed. This rate of change of pad temperature can be monitored to indicate the end point of the Chemical Mechanical Polishing operation.

While the invention has been particularly shown and described with reference to the preferred embodiments thereof, it will be understood by those skilled in the art that various changes in form and details may be made without departing from the spirit and scope of the invention.

What is claimed is:

1. A method of planarizing wafers with shallow trench isolation, comprising the steps of:

providing a semiconductor wafer;

forming a layer of pad oxide on said semiconductor wafer;

forming a layer of silicon nitride on said layer of pad oxide thereby forming a silicon nitride plane wherein said layer of pad oxide and said semiconductor wafer are below said silicon nitride plane;

forming isolation trenches in said semiconductor wafer wherein each said isolation trench has a depth, a width, sidewalls, and a bottom thereby removing that part of said layer of pad oxide directly over said isolation trenches and that part of said layer of silicon nitride directly over said isolation trenches;

forming a layer of isolation oxide over said semiconductor wafer after forming said layer of silicon nitride and said isolation trenches thereby filling said isolation trenches with isolation oxide;

forming a layer of spin on glass over said layer of isolation oxide; and planarizing said semiconductor wafer after forming said layer of spin on glass by means of chemical mechanical polishing using an abrasive slurry thereby removing said layer of spin on glass and that part of said isolation oxide above said silicon nitride plane.

2. The method of claim 1 wherein said isolation oxide is $SiO_2$ formed by decomposition of tetraethyl orthosilicate.

3. The method of claim 1 wherein said isolation oxide is $SiO_2$ formed by decomposition of ozone tetraethyl orthosilicate.

4. The method of claim 1 wherein said isolation oxide is $SiO_2$ formed using a high density plasma discharge.

5. The method of claim 1 wherein said abrasive slurry is an oxide slurry and the polishing rate for said isolation oxide is about two times greater than the polishing rate for said spin on glass.

6. The method of claim 1 wherein forming said layer of spin on glass comprises forming a first sublayer of spin on glass over said layer of isolation oxide and forming a second sublayer of spin on glass over said first sublayer of spin on glass.

7. The method of claim 1 wherein said depth of said isolation trenches is between about 0.4 microns and 0.6 microns.

8. The method of claim 1 wherein said pad oxide is silicon dioxide.

9. A method of planarizing wafers with shallow trench isolation, comprising the steps of:

providing a semiconductor wafer;

forming a layer of pad oxide on said semiconductor wafer;

forming a layer of silicon nitride on said layer of pad oxide thereby forming a silicon nitride plane wherein said layer of pad oxide and said semiconductor wafer are below said silicon nitride plane;

forming isolation trenches in said semiconductor wafer wherein each said isolation trench has a width, a depth, sidewalls, and a bottom thereby removing that part of said layer of pad oxide directly over said isolation trenches and that part of said layer of silicon nitride directly over said isolation trenches;

forming a layer of insulator oxide on said sidewalls and said bottoms of said isolation trenches;

forming a layer of polysilicon over said semiconductor wafer after forming said layer of silicon nitride and said layer of insulator oxide on said sidewalls and said bottoms of said isolation trenches thereby filling said isolation trenches with polysilicon;

forming a layer of spin on glass over said layer of polysilicon; and planarizing said semiconductor wafer after forming said layer of spin on glass by means of chemical mechanical polishing using an abrasive slurry thereby removing said layer of spin on glass and that part of said layer of polysilicon above said silicon nitride plane.

10. The method of claim 9 wherein said abrasive slurry is an oxide slurry and the polishing rate for said polysilicon is between about 4 and 6 times greater than the polishing rate for said spin on glass.

11. The method of claim 9 wherein said chemical mechanical polishing uses a polishing pad and the endpoint of said chemical mechanical polishing is determined by the rate of change of the temperature of said polishing pad.

12. The method of claim 9 wherein forming said layer of spin on glass comprises forming a first sublayer of spin on glass over said layer of isolation oxide and forming a second sublayer of spin on glass over said first sublayer of spin on glass.

13. The method of claim 9 wherein said depth of said isolation trenches is between about 0.4 microns and 0.6 microns.

14. The method of claim 9 wherein said pad oxide is silicon dioxide.

15. The method of claim 9 wherein said insulator oxide is $SiO_2$ having a thickness of between about 200 and 800 Angstroms.

* * * * *